(12) United States Patent
Lee

(10) Patent No.: US 11,535,550 B2
(45) Date of Patent: Dec. 27, 2022

(54) YTTRIUM ALUMINUM SILICATE GLASS CERAMIC COATING FOR SEMICONDUCTOR CHAMBER APPARATUS

(71) Applicant: Morgan Advanced Ceramics, Inc., Hayward, CA (US)

(72) Inventor: Chengtsin Lee, Hayward, CA (US)

(73) Assignee: Morgan Advanced Ceramics, Inc., Hayward, CA (US)

( * ) Notice: Subject to any disclaimer, the term of this patent is extended or adjusted under 35 U.S.C. 154(b) by 923 days.

(21) Appl. No.: 16/343,300

(22) PCT Filed: Nov. 2, 2017

(86) PCT No.: PCT/EP2017/078048
§ 371 (c)(1),
(2) Date: Apr. 18, 2019

(87) PCT Pub. No.: WO2018/083174
PCT Pub. Date: May 11, 2018

(65) Prior Publication Data
US 2019/0256405 A1    Aug. 22, 2019

Related U.S. Application Data

(60) Provisional application No. 62/416,369, filed on Nov. 2, 2016.

(51) Int. Cl.
*C03C 8/06* (2006.01)
*C03C 3/095* (2006.01)
(Continued)

(52) U.S. Cl.
CPC ............... *C03C 8/06* (2013.01); *C03C 3/095* (2013.01); *C03C 3/112* (2013.01); *C03C 8/02* (2013.01);
(Continued)

(58) Field of Classification Search
CPC ........... C03C 8/06; C03C 3/095; C03C 3/112; C03C 8/02; C03C 2209/00; C04B 41/009;
(Continued)

(56) References Cited

U.S. PATENT DOCUMENTS

2008/0016684 A1 * 1/2008 Olechnowicz .......... C03C 3/062
29/748
2008/0009417 A1    10/2008 Lou et al.
(Continued)

FOREIGN PATENT DOCUMENTS

DE    102014106560 B3    7/2015
EP    1188731 A2    3/2002
(Continued)

OTHER PUBLICATIONS

PCT Written Opinion in PCT/EP2017/078048 dated Jan. 26, 2018, 8 pages.
(Continued)

*Primary Examiner* — Karl E Group
*Assistant Examiner* — Cameron K Miller
(74) *Attorney, Agent, or Firm* — Servilla Whitney LLC

(57) ABSTRACT

Articles may be protected against halide plasma, by applying a rare earth-containing glaze to the surface of the article. The glaze may be a coating comprising; 20 to 90 mol % $SiO_2$, 0 to 60 mol % $Al_2O_3$, 10 to 80 mol % rare earth oxides and/or rare earth fluorides (REX), wherein $SiO_2+Al_2O_3+REX \geq 60$ mol %.

15 Claims, 4 Drawing Sheets

(51) Int. Cl.
*C03C 3/112* (2006.01)
*C03C 8/02* (2006.01)
*C04B 41/00* (2006.01)
*C04B 41/50* (2006.01)
*C04B 41/86* (2006.01)
*H01L 21/687* (2006.01)

(52) U.S. Cl.
CPC ........ *C04B 41/009* (2013.01); *C04B 41/5022* (2013.01); *C04B 41/5023* (2013.01); *C04B 41/86* (2013.01); *H01L 21/68757* (2013.01); *C03C 2209/00* (2013.01)

(58) Field of Classification Search
CPC ... C04B 41/5022; C04B 41/86; C04B 35/101; C04B 35/1015; H01L 21/68757

See application file for complete search history.

(56) References Cited

U.S. PATENT DOCUMENTS

2011/0256411 A1  10/2011  Courcot et al.
2018/0010234 A1*  1/2018  Sun .................... C04B 41/4529

FOREIGN PATENT DOCUMENTS

EP      2011777 A2   1/2009
EP      2284139 A2   2/2011

OTHER PUBLICATIONS

Garcia, Eugenio, et al., "Superior Performance of Ablative Glass Coatings Containing Graphene Nanosheets", The American Ceramic Society, Jul. 9, 2016, 4066-4072.

Smeacetto, F., et al., "Protective coatings for carbon bonded carbon fibre composites", Ceramics International, 5 pages.

PCT International Search Report in PCT/EP2017/078048, dated Jan. 26, 2018, 3 pages.

* cited by examiner

| Element | Wt% |
|---|---|
| O | 41.50 |
| Mg | 0.72 |
| Al | 13.87 |
| Si | 15.91 |
| Y | 27.99 |
| Total: | 100.00 |

YTTRIUM ALUMINUM SILICATE GLASS CERAMIC COATING FOR SEMICONDUCTOR CHAMBER APPARATUS

CROSS-REFERENCE TO RELATED APPLICATIONS

This application is the National Stage entry of PCT/EP2017/078048, filed on Nov. 2, 2017, which claims priority U.S. Appln. Ser. No. 62/416,369, filed on Nov. 2, 2016, which are incorporated herein by reference in their entireties.

FIELD OF THE INVENTION

The present invention relates to coated ceramics for use in environments where exposure to plasma is to be expected; and is particularly, although not exclusively, related to coatings of ceramic components used in semiconductor manufacture.

BACKGROUND

Semiconductor manufacture involves exposure to aggressive environments including, for example, exposure to fluorine or chlorine containing plasmas.

Ceramics, for example alumina and aluminum nitride, are common materials used in semiconductor chamber components such as lids, nozzles and electrostatic chucks. However, due to their high reactivity with halide (typically fluorine or chlorine) based plasma, it is known to provide protective coatings of yttrium aluminum garnet (YAG) or yttria ($Y_2O_3$) to ceramics used in such environments.

Dense and smooth coatings with high plasma erosion resistance are ideal for reduced particle defect on semiconductor processing; however, current coating methods for YAG and like coatings are insufficient to produce smooth coatings on all substrates.

Plasma sprayed coatings are porous and rough whatever the substrate.

Thin film deposition methods such as e-beam deposition, atomic layer deposition (ALD), chemical vapor deposition (CVD) and sputtering may generate dense and smooth coatings, but to do so require a dense and smooth substrate. This is because the thin coatings tend to duplicate the substrate surface, and any defects on the substrate materials such as grain pull-out, damage or scratches, will be transferred to the coating surface and so has the potential for defects on the coating.

Therefore, there is a need for articles having a dense and smooth coating with good erosion resistance.

SUMMARY OF THE INVENTION

In a first aspect of the present invention, there is provided a rare earth coating comprising;
20 to 90 mol % $SiO_2$
0 to 60 mol % $Al_2O_3$
10 to 80 mol % rare earth oxides and or rare earth fluorides (REX), wherein $SiO_2+Al_2O_3+REX \geq 60$ mol %.

Optionally, the amount of rare earth elements in mol % is greater than the amount of Al in mol %.

The present invention, in particular, addresses this need to develop plasma resistant coatings over ceramics such as alumina and AlN by providing a glaze coating.

The coating is preferably resistant to halide (e.g. fluorine or chlorine) based plasma.

Preferably, the molar % of $SiO_2$ is greater than the molar % of $Al_2O_3$.

In some embodiments, the rare earth coating comprises:

| | |
|---|---|
| $SiO_2$ | 40-80 mol % |
| $Al_2O_3$ | 5-20 mol % |
| REX | 15-55 mol % |

In alternative embodiments, the rare earth coating comprises:

| | |
|---|---|
| $SiO_2$ | 50-75 mol % |
| $Al_2O_3$ | 5-9.9 mol % |
| REX | 15-40 mol % |

Preferably, the ratio of rare earth oxides to rare earth fluorides is between 1:10 and 10:1 and more preferably between 5:10 and 10:5.

In a preferred embodiment, REX comprises yttrium oxide and/or yttrium fluoride.

Preferably, the coating comprises at least 5 mol % rare earth fluorides, as the fluorides increase the glass formation range of the REX glass, as well as also increasing the coefficient of thermal expansion (CTE) of the glass to have a better match with the substrate, such as alumina. The rare earth fluorides may be present in amounts up to 50 mol %, or even more, but typically can be present in amounts up to 40 mol %, or up to 30 mol %.

The coating may further comprise fluorides of one or more of Y, La, Zr, Sc, Nd, Ce and Al.

The coating is preferably a glassy coating or a glass ceramic coating.

The surface roughness Ra of the coating is preferably less than 20 µm, more preferably less than 2 µm; even more preferably less than 1.5 µm and yet even more preferably less than 1.0 µm. In glass ceramic embodiments, which may comprises crystalline surface particles, the Ra of the coating is preferably less than 50 µm and more preferably less than 30 µm.

The open porosity of the coating is preferably less than 5.0%, more preferably less than 3.0% or less than 2.8% or less than 2.0% and even more preferably less than 1%.

In a second aspect of the present invention, there is provided a glaze precursor mixture comprising a composition to produce a coating of the first aspect of the present invention.

In a third aspect of the present invention, there is provided a coated article comprising a coating as defined in the first aspect of the present invention.

The article is preferably a ceramic article and more preferably comprises alumina or aluminum nitride.

There may be two or more coatings applied to the article of the same or different composition.

In a preferred embodiment, the article is an article for use in semiconductor manufacture.

In a fourth aspect of the present invention, there is provided a method for protecting an article against halide plasma, the method comprising applying a rare earth-containing glaze to the surface of the article.

Preferably, glaze precursors are applied to the surface of the article and the article and glaze precursors are fired to a temperature sufficient to convert the glaze precursors into a glaze.

The glaze precursors are preferably in the form of a slurry comprising glaze precursors in a carrier. The slurry is then applied to the surface of the article; and the article and glaze precursors are fired to a temperature sufficient to convert the glaze precursors into a glaze.

In a preferred embodiment, the glaze precursors comprise a glassy frit.

The glaze precursors preferably comprises the component to form the coatings as defined within the first aspect of the present invention.

Rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb) and yttrium (Y). As stated above, yttria is used in the form of yttrium aluminum garnet to provide plasma resistant coatings, and the applicants believe that other rare earth elements can also provide such resistance. Known plasma resistant coatings comprise sintered ceramics such as yttrium aluminum garnet.

By "glaze" is meant a coating, that may be applied in liquid form, which solidifies to form the coating, and the coating is either a glass, a partially crystallized glass, or a glass-ceramic.

Application as a glaze means that when liquid the glass at least partially fills any defects in the substrate, and surface tension in the liquid results in a glazed surface that is as smooth or smoother than the substrate to which the glaze is applied.

As an example, yttria containing glaze, for example an yttrium aluminum silicate (YAS) glaze has good erosion resistance and it can serve as substrate materials for other coatings such as physical vapor deposited (PVD) $YF_3$, $Y_2O_3$ etc.

In addition, a silica based surface is the preferred material for ALD process chamber due to its low surface recombination with radicals. Chamber surfaces with low recombination of radicals are critical for ALD processing for enhanced deposition rate and lower preventative maintenance (PM) cycle for processing chambers.

DETAILED DESCRIPTION OF PREFERRED EMBODIMENTS

The working of the invention is detailed through the following non-limitative examples:

EXAMPLE 1

YAS Coating Over Sintered Alumina Part a. Slurry preparation: 50 g of 523 SB (Wesgo brush paint vehicle—a non-aqueous solvent based lacquer forming carrier having a viscosity in the range 100-120cPs at 24° C. and comprising alkyl cellulose in a mixed hydrocarbon/ketone solvent) is mixed with 50 g of $Y_2O_3$ powder (39R—Inframat Advanced Material, 99.995% $Y_2O_3$), 50 g $SiO_2$ powder (Morgan internal ground $SiO_2$) and 10 g of $Al_2O_3$ (99.8% pure, CT3000, Almatis). The slurry is milled with alumina media on a roll miller for one hour. This composition is equivalent to a target inorganic composition of ~19.2 mol % rare earth oxide, 72.3 mol % $SiO_2$, and 8.5 mol % $Al_2O_3$.
b. Apply coating over alumina parts via spin coat at 60 RPM. Samples were dried at room temperature for 4 hours before put inside the 80 C oven for 1 hour.

Figure 1:
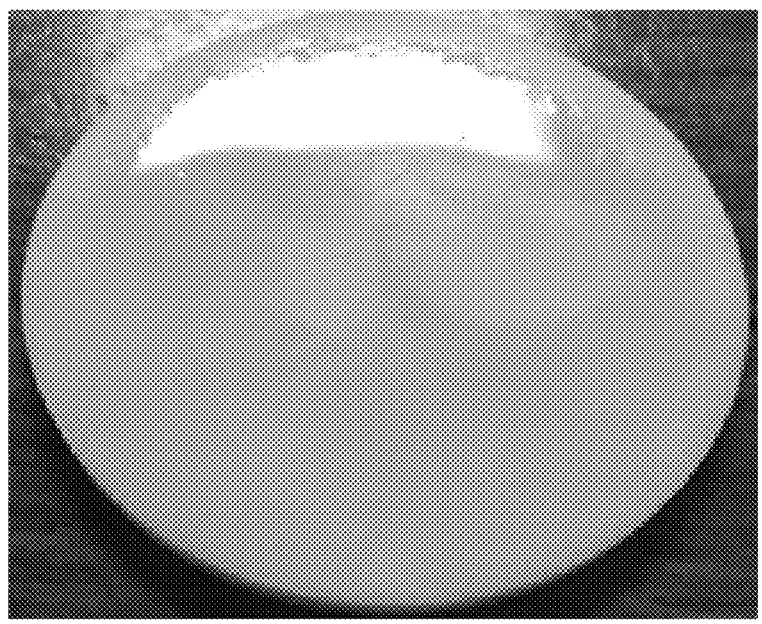
FIG. 1 is a photograph image of a yttrium aluminum silicate (YAS) coating over an alumina substrate according to one embodiment of the present invention (Example 1)
Figure 2:
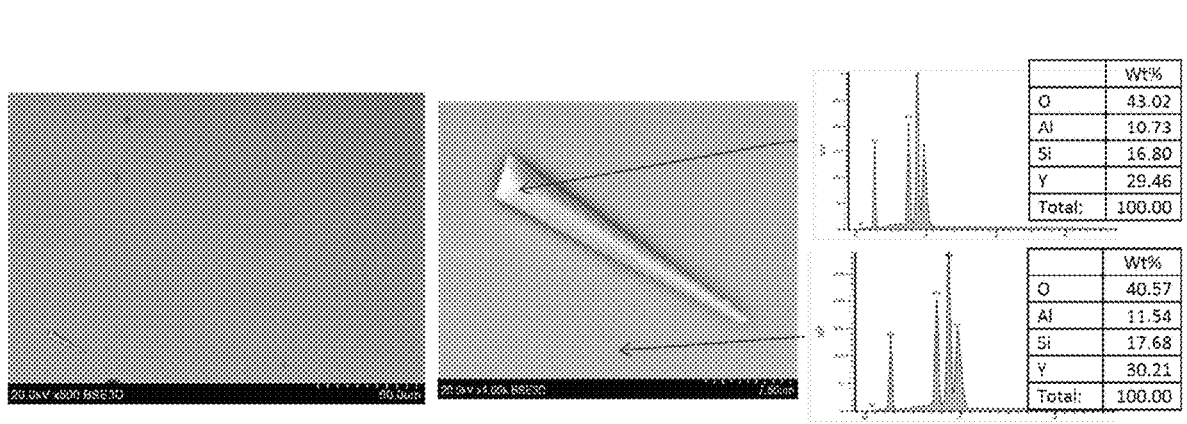
FIG. 2 is the SEM-EDS image and analysis results for the coating in FIG. 1.

Samples were sintered at 1550 C for 15 minutes in an air furnace. Optical micrograph and SEM-EDS analysis of the coating after firing is shown in FIG. 1 and FIG. 2, respectively. A few YAS based crystals were seen on the surface of the glaze coating. The surface roughness (Ra) of the glass coating is 1-3 micro inches (0.025-0.075 μm).

EXAMPLE 2

YAS Coating Over Sintered AlN Part a. Slurry preparation: 50 g of 523 SB (Wesgo brush paint vehicle) is mixed with 50 g of $Y_2O_3$ powder (39R—Inframat Advanced Material, 99.995% $Y_2O_3$), 50 g $SiO_2$ powder (Morgan internal ground $SiO_2$) and 10 g of $Al_2O_3$ (99.8% pure, CT3000, Almatis). The slurry is milled with alumina media on a roll miller for one hour.
b. Apply $Y_2O_3$ coating over AlN parts via spin coat at ~60 RPM. Samples were dried at room temperature for 4 hours before put inside the 80 C oven for 1 hour.

Figure 3:
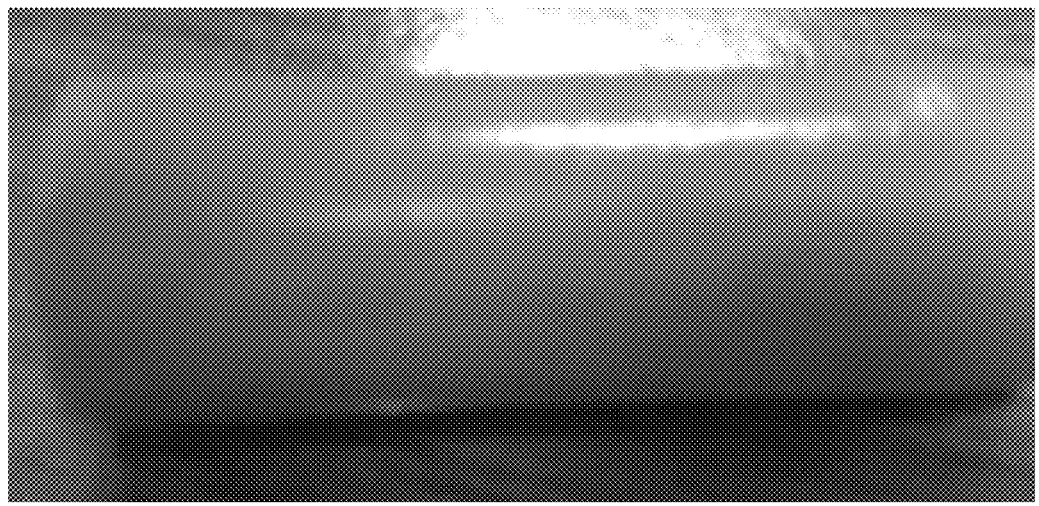
FIG. 3 is a photograph image of a YAS coating over an alumina nitride substrate according to another embodiment of the present invention (Example 2).
Figure 4:
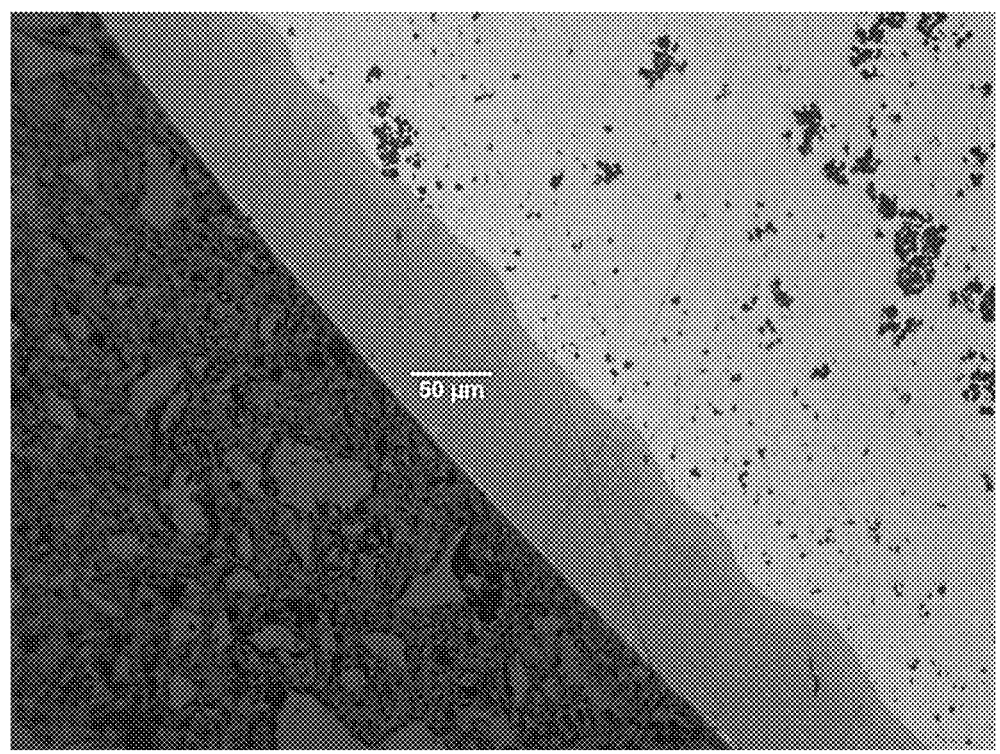
FIG. 4 is a cross-sectional image of the YAS coating of FIG. 3.

Samples were sintered at 1550 C for 15 minutes in a $N_2$ furnace. Optical micrograph and cross-sectional view of the coating after firing is shown in FIGS. 3 and 4, respectively. It can be observed that application of the coating results in a coating with a reduced surface roughness in comparison with the sintered aluminum nitride, with surface roughness (Ra) of less than 1 μm.

EXAMPLE 3

YAS Coating Over Alumina Substrates

Figure 5:
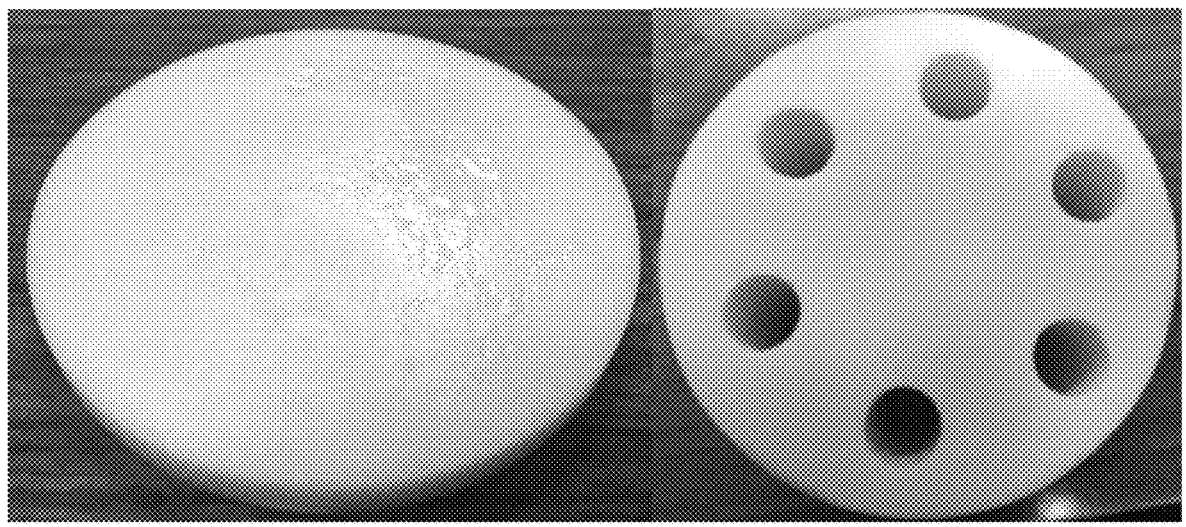
FIG. 5 is a photograph image of a YAS coating over an alumina substrate sintered at 1650° C. for 2 hours according to a further embodiment of the present invention (Example 3).
Figure 6:
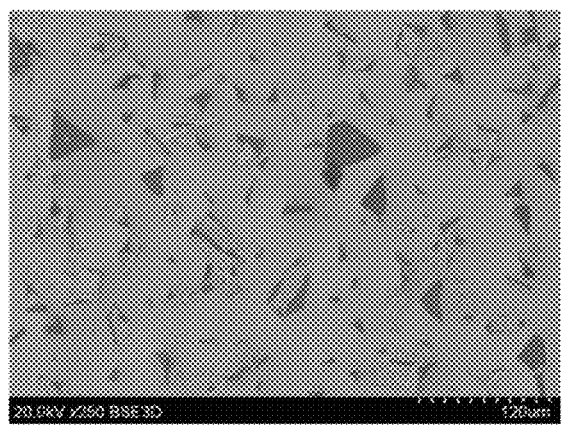
FIG. 6 is the SEM-EDS image and analysis results for the coating in FIG. 5.
Figure 6:
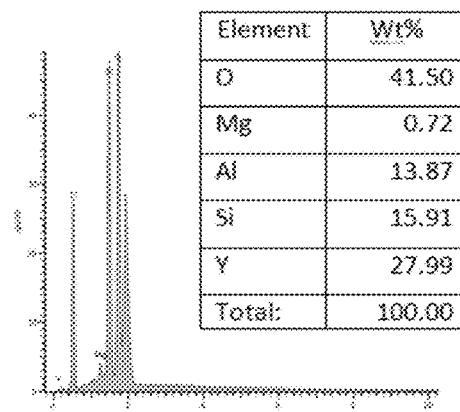

Same coating composition as described on example 1 was applied over alumina based substrates. Samples were dried at 80 C for one hour followed by sintering in an air furnace to 1650 C for 2 hours. The surface morphology and SEM-EDS analysis of the coating is shown on FIGS. 5 and 6, respectively. The high temperature heat treatment created glass-ceramic coating and have more YAS based crystals formed on the surface. Although the surface finish of glass-ceramic coating is not as good as the glaze like coating shown on FIG. 1 but the glass ceramic coating still has good surface finish without any subsurface damage or grain pull-out features of the typical machined ceramics. The glass ceramic coating had a surface roughness of about 30-60 microinches (~0.76-1.5 μm).

EXAMPLE 4

YASF Coating Over Sintered Alumina Part a. Slurry preparation: 50 g of 523 SB (Wesgo brush paint vehicle) is mixed with 50 g of $Y_2O_3$ powder (39R—Inframat Advanced Material, 99.995% $Y_2O_3$), 50 g $SiO_2$ powder (Morgan internal ground $SiO_2$), 50 g of $YF_3$ (99.9% pure, Inframat Advanced Materials) and 10 g of $Al_2O_3$ (99.8% pure, CT3000, Almatis). The slurry is milled with alumina media on a roll miller for one hour. This composition is equivalent to a target inorganic composition of 14.8 mol % rare earth oxide, 22.9% rare earth fluoride, 55.7 mol % $SiO_2$, and 6.6 mol % $Al_2O_3$.

b. Apply coating over alumina parts via spin coat at ~60 RPM. Samples were dried at room temperature for 4 hours before put inside the 80 C oven for 1 hour.

Figure 7:
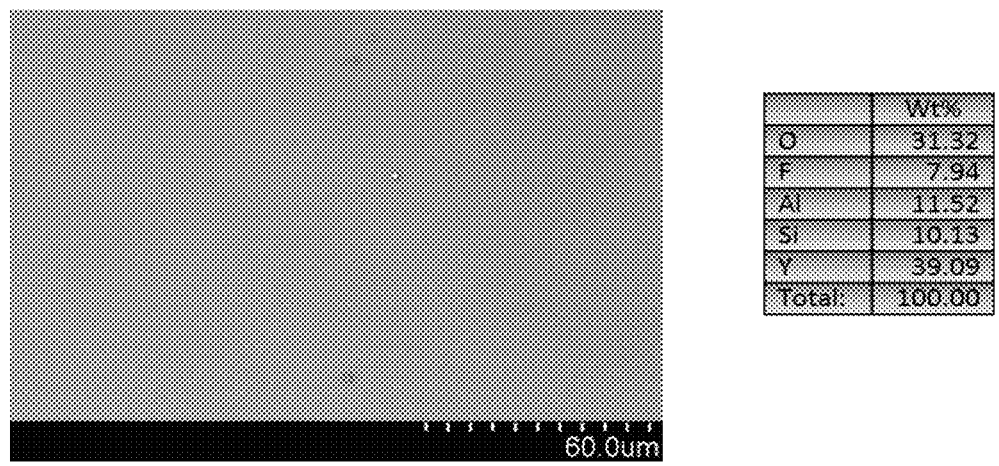
FIG. 7 is the SEM-EDS image and analysis results for a YASF coating over a sintered alumina article in Example 4.

Samples were sintered at 1500 C for 15 minutes in a $N_2$ furnace. SEM-EDS analysis of the coating after firing is shown in FIG. 7. It suggests that the addition of $YF_3$ to glass decreases the Si content and increases Y content of the glaze, so that there is a significant amount of F present in the glaze.

It is believed that the addition of $YF_3$ significantly increased the glass formation range of the YAS glass, it also increase the coefficient of thermal expansion (CTE) of the glass to have a better match with the alumina substrate.

The CTE of YAS glass shown in example 1 has CTE 5 ppm/K slightly lower than the alumina substrate (CTE 7 ppm/K), therefore a thick coating may resulted in cracking. The addition of fluoride into the YAS glass increased the CTE of glass (CTE of $YF_3$ and $Y_2O_3$ are 13 ppm/K and 7 ppm/K; respectively).

In addition, under fluorine attack one mole of $Y_2O_3$ would lead to two moles of $YF_3$. The molecular weight of $Y_2O_3$ is 225.81 g/mol and its density is 5.01 g/cm³ so the molar volume is 45.1 cm³/mol. The molecular weight of $YF_3$ is 145.9 g/mol and its density is 4.01 g/cm³ so the molar volume is ~36.4 cm³/mol. This means that fluorinating a mole of $Y_2O_3$ completely to $YF_3$ would lead to an increase in molar volume from 45.1 cm³/mol to ~72.8 cm³/mol. By incorporating $YF_3$ into the material, the volume change consequent on fluorine attack will be reduced. This, in combination with the closer matching of CTE to alumina, leads to a lessened propensity to crack after fluorine attack.

FURTHER EXAMPLES

Table 1 shows further materials used as coatings and particularly to coat alumina and aluminum nitride substrates.

These materials had different attributes.

As mentioned with respect to Example 4, the presence of fluorine (YASF) leads to a lessened propensity to crack after fluorine attack.

Zirconia addition (YASZ) and MgO addition (YASM) also provides better crack resistance, in part through the ability to tailor CTE with substrates.

In addition, both zirconia and MgO lower viscosity permitting good flow of the coating.

Zirconia may be present in amounts up to 20 mol %, or up to 15 mol %, or up to 10 mol %, or up to 5 mol %.

MgO may be present in amounts up to 20 mol %, or up to 15 mol %, or up to 10 mol %, or up to 6 mol %.

Coatings within some embodiments may comprise:

| | |
|---|---|
| 40-80 mol % | $SiO_2$ |
| 5-40 mol % | $Al_2O_3$ |
| 0.1-20 mol % | $ZrO_2$ and/or MgO |
| 10-35 mol % | REX |

In contrast YASH had a higher viscosity, enabling selected areas of substrate to be coated, but importantly also showed a very low etch rate. In particular, the YASH coating displayed a significantly lower etch rate when compared to the YAS sample, when assessed using comparable methodology to that described in US2009/0214825 (table one; FIG. 7b; and associated text). Within some YASH embodiments, coatings may comprise:

| | |
|---|---|
| 5-20 mol % | $SiO_2$ |
| 40-60 mol % | $Al_2O_3$ |
| 20-55 mol % | REX |

In the examples a lacquer forming carrier was used, but this is not essential. Other carriers (for example terpineol oil, isopropyl alcohol, acetone, or inks) may be used to deliver the glaze precursors to the surface of the article.

Components other than $SiO_2$, $Al_2O_3$, and rare earth oxides and fluorides may be present. The amount of such other components may be as much as 40 mol % or less than 30 mol %, less than 20 mol %, less than 10 mol % or less than 5 mol %. $SiO_2+Al_2O_3+REX$ may be ≥60 mol %, ≥70 mol %, ≥80 mol %, ≥85 mol %, ≥90 mol %, or ≥95 mol %.

TABLE 1

| | | Sample reference | | | | | |
|---|---|---|---|---|---|---|---|
| | | YASH | YAG | YAS | YASM | YASZ | YASF |
| Mole % compound | Al2O3 | 51.1% | 58.5% | 20.7% | 19.8% | 19.1% | 34.9% |
| | SiO2 | 15.7% | 8.6% | 62.4% | 59.9% | 61.9% | 36.1% |
| | MgO | 0.0% | 0.0% | 0.0% | 5.6% | 0.0% | 0.0% |
| | ZrO2 | 0.0% | 0.0% | 0.0% | 0.0% | 4.6% | 0.0% |
| | Y2O3 | 33.2% | 33.0% | 16.9% | 14.6% | 14.5% | 19.5% |
| | YF3 | 0.0% | 0.0% | 0.0% | 0.0% | 0.0% | 9.5% |
| | REX | 33.2% | 33.0% | 16.9% | 14.6% | 14.5% | 29.0% |
| | Sintering Temperature (° C.) | 1675 | 1743 | 1500 | 1500 | 1500 | 1450 |

In addition to the claimed ranges, the coatings may comprise

| | |
|---|---|
| 20-80 mol % | SiO$_2$ |
| 2-40 mol % | Al$_2$O$_3$ |
| 20-55 mol % | REX | or

| | |
|---|---|
| 20-40 mol % | SiO$_2$ |
| 10-40 mol % | Al$_2$O$_3$ |
| 20-40 mol % | REX |

For use in semiconductor manufacture it is preferable (although not essential) that the alkali metal content (if present) be kept low, for example, expressed as oxide, at less than 0.5 mol %, less than 0.1 mol % or even lower.

To facilitate glass formation it is preferable (although not essential) that any transition metals (if present) be kept low, for example, expressed as oxide, at less than 10 mol %, less than 5 mol %, less than 1 mol % or even lower.

In contrast to the coating of the present invention, conventional plasma sprayed Y$_2$O$_3$ coating has a relatively rough surface, but after polishing the surface roughness reduces to about 8 microinches (0.2 μm). The polished surface typically has about 3% open porosity within the coating with the surface comprising small pores and residual particles that affect performance.

The presently disclosed coatings not only provide a halogen-plasma resistant coating, they also provide a dense and smooth surface leading to low particle contamination and easy cleaning.

The invention claimed is:

1. A coated article comprising: a substrate and a coating comprising: 20 to 90 mol % SiO$_2$; 0 to 60 mol % Al$_2$O$_3$; and 10 to 80 mol % total rare earth oxides and rare earth fluorides (REX); wherein SiO$_2$+Al$_2$O$_3$+REX≥60 mol % of a total amount of the coating, and wherein the rare earth fluorides are present in an amount of at least 5 mol % of the total amount of the coating.

2. The coated article according to claim 1, wherein the substrate comprises alumina or aluminum nitride.

3. The coated article of claim 1, wherein the coating comprises the rare earth elements in mol % in an amount greater than an amount of Al in mol %.

4. The coated article of claim 1, wherein the coating comprises the molar % of SiO$_2$ in an amount greater than the molar % of Al$_2$O$_3$.

5. The coated article of claim 1, wherein the coating comprises:

| | |
|---|---|
| 20 to 90 mol % | SiO$_2$; |
| 0 to 40 mol % | Al$_2$O$_3$; and |
| 10 to 80 mol % | REX[[,]]. |

6. The coated article of claim 5, wherein the coating comprises:

| | |
|---|---|
| 40-80 mol % | SiO$_2$; |
| 5-20 mol % | Al$_2$O$_3$; and |
| 15-55 mol % | REX. |

7. The coated article of claim 6, wherein the coating comprises:

| | |
|---|---|
| 50-75 mol % | SiO$_2$; |
| 5-9.9 mol % | Al$_2$O$_3$; and |
| 15-40 mol % | REX. |

8. The coated article of claim 1, wherein the REX of the coating comprises yttrium oxide and/or yttrium fluoride.

9. The coated article of claim 1, wherein the coating further comprising fluorides of one or more of Y, La, Zr, Sc, Nd, Ce and Al.

10. The coated article of claim 1, wherein the coating comprises SiO$_2$+Al$_2$O$_3$+REX in an amount of 95 mol % or more.

11. The coated article of claim 1, wherein the coating further comprises less than 0.5 mol % of an alkali metal, expressed as an oxide.

12. The coated article of claim 1, wherein the coating further comprises ZrO$_2$ in an amount up to 20 mol %.

13. The coated article of claim 1, wherein the coating comprises less than 10 mol % of transition metal(s), expressed as an oxide.

14. The coated article of claim 1, further comprising MgO in an amount up to 20 mol %.

15. A glaze precursor mixture comprising a carrier, and a composition to produce a coating comprising: 20 to 90 mol % SiO$_2$; 0 to 60 mol % Al$_2$O$_3$; and 10 to 80 mol % total rare earth oxides and rare earth fluorides (REX); wherein SiO$_2$+Al$_2$O$_3$+REX≥60 mol % of a total amount of the coating, and wherein the rare earth fluorides are present in an amount of at least 5 mol % in the total amount of the coating.

* * * * *